(12) United States Patent
Kang et al.

(10) Patent No.: US 7,417,496 B2
(45) Date of Patent: Aug. 26, 2008

(54) DEMODULATOR CIRCUIT OF RFID SYSTEM

(75) Inventors: Tae Young Kang, Seoul (KR); Kyung Hwan Park, Daejeon (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 181 days.

(21) Appl. No.: 11/588,456

(22) Filed: Oct. 27, 2006

(65) Prior Publication Data

US 2007/0127560 A1    Jun. 7, 2007

(30) Foreign Application Priority Data

Dec. 6, 2005   (KR) .................. 10-2005-0118237
Jun. 7, 2006   (KR) .................. 10-2006-0050836

(51) Int. Cl.
*H03D 1/00*   (2006.01)
*H03K 5/153*   (2006.01)
*H03K 9/00*   (2006.01)
*H04L 27/06*   (2006.01)

(52) U.S. Cl. .................. 329/311; 327/81; 375/320; 375/340

(58) Field of Classification Search ......... 329/311–314, 329/347, 369; 327/50, 77, 80–82; 375/320, 375/340; 455/272–274, 280, 291, 293, 337, 455/575

See application file for complete search history.

(56) References Cited

U.S. PATENT DOCUMENTS

| 6,294,953 | B1 | 9/2001 | Steeves |
| 7,277,687 | B2 * | 10/2007 | Terry .................. 455/293 |
| 2002/0149482 | A1 | 10/2002 | Shanks et al. |
| 2003/0231566 | A1 | 12/2003 | Smith et al. |
| 2004/0056691 | A1 | 3/2004 | Prexl et al. |

FOREIGN PATENT DOCUMENTS

| JP | 2004-062665 | 2/2004 |
| KR | 1998-0032297 | 7/1998 |
| KR | 1019980032297 | 7/1998 |
| KR | 1998-0070123 | 10/1998 |
| KR | 1020000041374 | 7/2000 |
| KR | 1020060060200 | 6/2006 |
| WO | WO2005/057778 | 6/2005 |

* cited by examiner

*Primary Examiner*—David Mis
(74) *Attorney, Agent, or Firm*—Ladas & Parry LLP

(57) ABSTRACT

Provided is a demodulator circuit allowing a tag or transponder to efficiently recover data of an input amplitude signal at very low power in a wireless communication system such as a radio frequency identification (RFID) system. The demodulator connects an output of a voltage multiplier to a low-current path by capacitive coupling, thereby recovering data. Therefore, data is recovered, at low power, from an input amplitude signal having a low modulation depth, and it is possible to increase a communication distance.

6 Claims, 1 Drawing Sheet

DEMODULATOR CIRCUIT OF RFID SYSTEM

CROSS-REFERENCE TO RELATED APPLICATION

This application claims priority to and the benefit of Korean Patent Application Nos. 2005-118237, filed Dec. 6, 2005, and 2006-50836, filed Jun. 7, 2006, the disclosures of which are incorporated herein by reference in their entirety.

BACKGROUND

1. Field of the Invention

The present invention relates to a demodulator circuit used in a tag or transponder in a radio frequency identification (RFID) system, and more particularly, to a demodulator circuit capable of generating a clearly level-identified output signal upon receiving an input amplitude signal having several modulation depths.

2. Discussion of Related Art

In general, an RFID tag is used in wireless communication systems such as an RFID system, and operates by receiving an amplitude signal from a reader. A communication distance between an RFID tag and a reader is defined by power consumption of the RFID tag. Since such a communication distance is a very important factor in application fields as well as performance of a system, researches for improving the communication distance have been constantly in progress.

However, conventional RFID tags require extremely-limited available driving voltage, and amplitude signals input thereto have very low power levels. Thus, it is exceedingly difficult to embody a data recovery circuit capable of detecting a modulation signal at low power.

Methods for solving such a technical problem have been suggested in U.S. Patent Laid-Open Publication Nos. 20040056691A1 and 20050104573A1 in which a voltage multiplier for data recovery comprises two output capacitors having different capacitance connected to inputs of a voltage comparator, and the voltage comparator compares voltages of the two capacitors with each other whenever the level of a tag input signal is changed. In addition, a method for comparing an output voltage of a voltage multiplier for data recovery with a reference voltage has been suggested in U.S. Patent Laid-Open Publication No. 20020149482A1, and also a method for converting output voltage of a voltage multiplier for data recovery into current and recovering data from variation of the current has been suggested.

However, the above-mentioned methods have drawbacks in that the period of a signal to be recovered may be somewhat changed by an offset difference of a compared voltage due to use of a comparator, there are many current paths due to the same reason, and a large amount of power is consumed due to use of an inverter.

When a reader used in an RFID system outputs an amplitude signal, a tag converts the signal into a direct current (DC) signal and then uses the DC signal as driving power for an entire circuit in the tag while detecting amplitude variation of the signal and decoding command data. A small modulation depth of an input amplitude signal is favorable to obtain large driving power, but a large modulation depth is favorable to easily detect an envelope upon demodulation. Here, a modulation depth is defined by following Formula 1:

$$\text{Modulation depth} = (\text{high} - \text{low})/(\text{high} + \text{low}) \times 100\%. \quad \text{Formula 1}$$

Because of the above-described reason, most RFID systems comprise a demodulator circuit that utilizes 100% of the modulation depth in the relatively short duration of a low level by adopting an encoding method making the duration of a high level of an input amplitude signal longer than the duration of a low level. Here, a conventional RFID demodulator circuit compares a signal passing through an envelope detector using a comparator, and generates a detected signal that can be classified into a high level and a low level. However, when the reading range of an RFID system increases, it is hard to utilize 100% of a modulation depth, and only 10 to 30% of the modulation depth may be used.

When only a small modulation depth is used, the level of a data signal to be recovered by a tag does not have a large difference from the level of an amplitude signal for supplying driving power. The demodulator circuit of the tag should be able to recover small variation of the input signal into a logic signal of "0" or "1." However, when the input signal is slightly changed, an amplifier should be additionally installed or the number of stages of a voltage multiplier should be increased so as to amplify the signal. Therefore, power consumption for data recovery increases, and desired impedance of a tag is not easily obtained or driving power for the tag needs to be reduced.

SUMMARY OF THE INVENTION

The present invention suggests a demodulator circuit capable of performing, at low power, recovery of data from a slightly varying input amplitude signal. It is an object of the present invention to provide a radio frequency identification (RFID) demodulator circuit for detecting output variation of a voltage multiplier for data recovery by capacitive coupling the output of the voltage multiplier to a node at which a P-channel metal oxide semiconductor (PMOS) transistor is connected to an N-channel metal oxide semiconductor (NMOS) transistor.

One aspect of the present invention provides a demodulator circuit of an RFID system, the demodulator circuit capacitively coupling a direct current (DC) output converted from an input amplitude signal in an envelope waveform corresponding to the input amplitude signal.

Preferably, the demodulator circuit comprises an NMOS transistor and a PMOS transistor biased by a constant gate voltage, wherein the DC output from a voltage multiplier or rectifier is capacitively coupled to a node at which drains of the P-channel metal oxide semiconductor (PMOS) and N-channel metal oxide semiconductor (NMOS) transistors biased by a constant gate voltage are connected to each other.

BRIEF DESCRIPTION OF THE DRAWINGS

The above and other features and advantages of the present invention will become more apparent to those of ordinary skill in the art by describing in detail preferred exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the exemplary embodiments disclosed below and can be implemented in various forms. Therefore, the present exemplary embodiments are provided for complete disclosure of the present invention and to fully inform the scope of the present invention to those of ordinary skill in the art.

Figure 1:
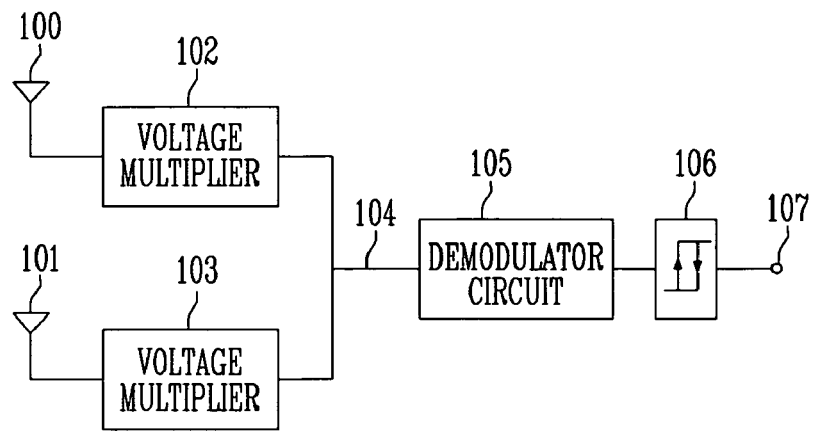
FIG. 1 is a block diagram of a wireless communication device recovering data of an input amplitude signal according to an exemplary embodiment of the present invention.

FIG. 1 is a block diagram of a wireless communication device recovering data of an input amplitude signal according to an exemplary embodiment of the present invention.

Referring to FIG. 1, the wireless communication device according to the present invention comprises voltage multipliers 102 and 103 for data recovery, a demodulator circuit 105, and a trigger circuit 106. Variation of an amplitude signal received at antennas 100 and 101 is first detected at the voltage multipliers 102 and 103 for data recovery. Here, an output signal 104 of the voltage multipliers 102 and 103 is an envelope of the signal applied to the antennas 100 and 101. The demodulator circuit 105 converts the output of the voltage multiplier 102 into a logic signal to be transmitted to a decoder, and the trigger circuit 106 waveform-shapes the converted logic signal.

Meanwhile, the amplitude signal received at the antennas 100 and 101 may be transmitted to a voltage multiplier (not shown) for tag driving power generation in parallel with the voltage multipliers 102 and 103 for data recovery. The voltage multiplier for tag driving power generation includes more diodes and capacitors than the general voltage multipliers 102 and 103 for data recovery so as to use most of the received amplitude signal for driving voltage generation.

Figure 2:
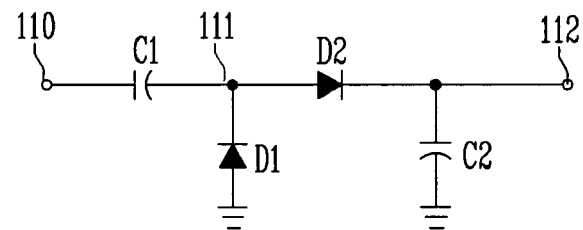
FIG. 2 is a circuit diagram of a voltage multiplier for data recovery according to an exemplary embodiment of the present invention.

FIG. 2 is a circuit diagram of a voltage multiplier for data recovery according to an exemplary embodiment of the present invention.

Referring to FIG. 2, the voltage multiplier for data recovery is configured of a circuit for converting a received amplitude signal into a direct current (DC) signal. The amplitude signal is input through a first capacitor C1 from an input node 110 connected to an antenna. When the input signal is positive, a second diode D2 is turned on and charges are accumulated in a second capacitor C2. When the input signal is negative, the second diode D2 is turned off, a first diode D1 is turned on, and charges are accumulated in a specific node 111. In this manner, DC voltage corresponding to the amplitude signal is generated at an output node 112 and input to a demodulator circuit.

Figure 3:
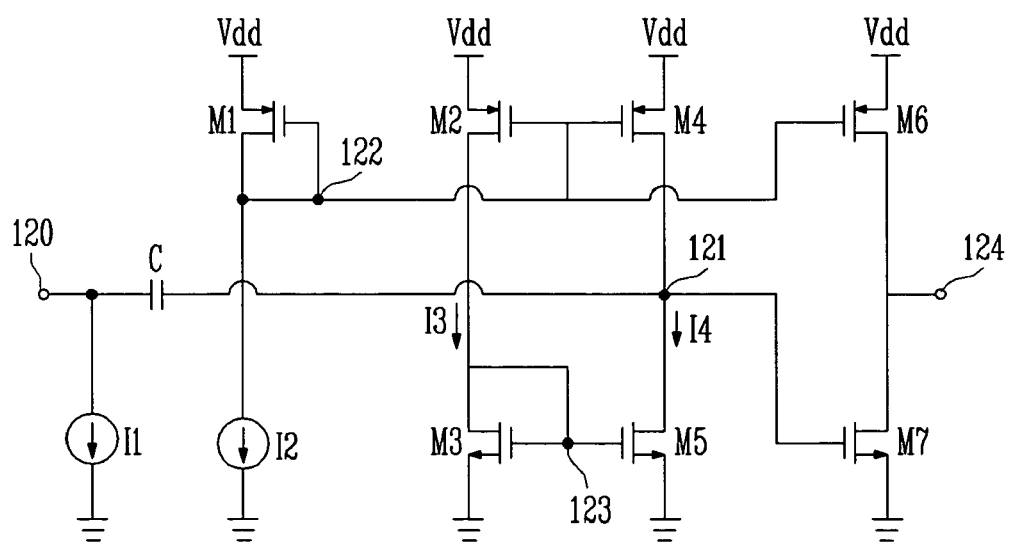
FIG. 3 is a circuit diagram of a demodulator circuit according to an exemplary embodiment of the present invention.

FIG. 3 is a circuit diagram of a demodulator circuit according to an exemplary embodiment of the present invention.

Referring to FIG. 3, the demodulator circuit according to the present invention comprises seven transistors M1 to M7 each having a first electrode, a second electrode and a control electrode, one capacitor C, and two current sources I1 and I2. In this embodiment, the first, second, fourth and sixth transistors M1, M2, M4 and M6 are P-channel metal oxide semiconductor (PMOS) transistors, and the third, fifth and seventh transistors M3, M5 and M7 are N-channel metal oxide semiconductor (NMOS) transistors. Here, the first and second electrodes of the transistors may respectively correspond to a drain and a source, and the control electrode may correspond to a gate.

One electrode of the capacitor C is connected to an input node 120 of the demodulator circuit, and the other electrode of the capacitor C is connected to the control electrode of the seventh transistor M7. The first current source I1 is connected between the one electrode of the capacitor C and a ground terminal.

The first electrode of the first transistor M1 is connected to a supply voltage terminal Vdd, the second electrode is connected to one terminal of the second current source I2, and the control electrode is diode-connected to the second electrode. The second current source I2 is connected between the second electrode of the first transistor M1 and the ground terminal. The first electrode of the second transistor M2 is connected to the supply voltage terminal Vdd, the second electrode is connected to the first electrode of the third transistor M3, and the control electrode is connected with the control electrode of the first transistor M1, the control electrode of the fourth transistor M4 and the control electrode of the sixth transistor M6. The second electrode of the third transistor M3 is connected to ground, and the control electrode is diode-connected to the first electrode. The first electrode of the fourth transistor M4 is connected to the supply voltage terminal Vdd, and the second electrode is connected to the first electrode of the fifth transistor M5, the other electrode of the capacitor C and the control electrode of the seventh transistor M7. The second electrode of the fifth transistor M5 is connected to the ground terminal, and the control electrode is connected to the control electrode of the third transistor M3. The first electrode of the sixth transistor M6 is connected to the supply voltage terminal Vdd, and the second electrode is connected to the first electrode of the seventh transistor M7. The second electrode of the seventh transistor M7 is connected to the ground terminal. Here, the sixth and seventh transistors M6 and M7 function as first and second output transistors in an output stage, respectively.

Operation of the demodulator circuit will be described below.

DC current generated from the voltage multiplier flows to the ground terminal through the first current source I1. When the first current source I1 for flowing DC voltage stored in the second capacitor C2 of the voltage multiplier to the ground terminal is not connected, the demodulator circuit cannot make the same voltage waveform as the envelope of an input amplitude signal and makes a waveform of a voltage which decreases according to a time constant based on capacitor capacity. Therefore, the first current source I1 is required to be connected to the input node 120. In this case, the amount of the current flowing to the ground terminal via the first current source I1 is very small, and thus hardly affects operation of a circuit for data recovery and a tag. The envelope waveform of the thus generated input amplitude signal is applied to an intermediate node 121 between the fourth and fifth transistors M4 and M5 through the capacitor C.

A node 122 at which the gate and drain of the first transistor M1 are connected is connected to the second current source I2, and provides the second, fourth and sixth PMOS transistors M2, M4 and M6 with a constant gate bias. Since the gates of the third and fifth NMOS transistors M3 and M5 are connected to each other and a node 123 between the gates is connected to the drain of the third transistor M3, the amount of current flowing through the second and third transistors M2 and M3 is the same as that flowing through the fourth and fifth transistors M4 and M5. In other words, the second and fourth PMOS transistors M2 and M4 and the third and fifth NMOS transistors M3 and M5 form a current mirror, and operate to make the current I3 flowing through the second and third transistors M2 and M3 identical to the current I4 flowing through the fourth and fifth transistors M4 and M5. Here, the amount of the current I3 flowing through the second and third transistors M2 and M3 is uniform. Therefore, when the amount of the current I3 is very small, the amount of the current I4 also becomes very small.

The fourth and fifth transistors M4 and M5 are equivalent to two resistors having great resistance connected in serial between the supply voltage terminal Vdd and the ground terminal. The signal applied through the input node 120 passes through a high pass filter (HPF) consisting of the capacitor C and the equivalent resistors of the fourth and fifth transistors M4 and M5, and then is applied to the intermediate node 121. Since the equivalent resistor of the fourth and fifth transistors M4 and M5 has very great resistance, the cutoff frequency of the HPF is several tens of kHz. The copied current I4 is very small, about 0.1 μA or less, and thus the voltage at the intermediate node 121 easily varies according to minute variation of the envelope waveform applied through the capacitor C. The varying voltage is applied to the gate of the seventh transistor M7, turns on/off the seventh transistor M7, and connects an output node 124 to the supply voltage terminal Vdd or the ground terminal, thereby converting the variation of the input amplitude signal into a logic signal, "0" or "1." The output 124 is waveform-shaped by the trigger circuit 106 of FIG. 1, and then transmitted to a decoder.

As described above, the demodulator circuit of an RFID system according to the present invention can recover data from an input amplitude signal having a small modulation depth, at low power.

According to the present invention, the output of a voltage multiplier is connected to a low current path by capacitive coupling so that data is recovered. Thus, data can be recovered from a signal having a small modulation depth in a tag of an RFID system, which makes more remote communication with a reader possible. In addition, operation at low power is possible and a chip size is reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A demodulator circuit of a radio frequency identification (RFID) system, the demodulator circuit capacitively coupling a direct current (DC) output converted from an input amplitude signal, in an envelope waveform corresponding to the input amplitude signal, to a point at which drains of P-channel metal oxide semiconductor (PMOS) and N-channel metal oxide semiconductor (NMOS) transistors biased by a constant gate voltage are connected to each other.

2. The demodulator circuit of claim 1, further comprising a capacitor having a first electrode connected to an input terminal and a second electrode connected to the point.

3. The demodulator circuit of claim 2, wherein the constant gate voltage is provided by a first transistor having a source connected to a supply voltage terminal, a drain connected to a current source, and a gate connected to the drain.

4. The demodulator circuit of claim 3, further comprising:
a third transistor having a source connected to the supply voltage terminal, and a gate connected to a gate of the PMOS transistor;
a fourth transistor having a drain connected to a drain of the third transistor, and connected with the NMOS transistor in a current mirror form;
a first output terminal transistor having a source connected to the supply voltage terminal, and a gate connected to the gate of the PMOS transistor; and
a second output terminal transistor having a drain connected to a drain of the first output terminal transistor, a gate connected to the point, and a source connected to a ground terminal.

5. A demodulator circuit of an RFID system, comprising:
an input terminal for receiving a DC output from a voltage multiplier or a rectifier;
a capacitor having one end connected to the input terminal;
a first transistor having a source connected to a supply voltage terminal, a drain connected to a current source, and a gate connected to the drain;
a second transistor having a source connected to the supply voltage terminal, and a gate connected to the gate of the first transistor;
a third transistor having a drain connected to a drain of the second transistor, a source connected to a ground terminal, and a gate connected to the drain;
a fourth transistor having a source connected to the supply voltage terminal, a drain connected to the other end of the capacitor, and a gate connected to the gate of the first transistor;
a fifth transistor having a drain connected to the drain of the fourth transistor, a source connected to the ground terminal, and a gate connected to the gate of the third transistor;
a sixth transistor having a source connected to the supply voltage terminal, and a gate connected to the gate of the first transistor; and
a seventh transistor having a drain connected to a drain of the sixth transistor, which is an output terminal, a gate connected to the drains of the fourth and fifth transistors, and a source connected to the ground terminal.

6. The demodulator circuit of claim 5, further comprising another current source connected to the input terminal and the one end of the capacitor.

* * * * *